United States Patent
Braun et al.

(10) Patent No.: US 6,392,918 B2
(45) Date of Patent: May 21, 2002

(54) CIRCUIT CONFIGURATION FOR GENERATING A REFERENCE VOLTAGE FOR READING A FERROELECTRIC MEMORY

(75) Inventors: Georg Braun, München (DE); Heinz Hönigschmid, East Fishkill, NY (US); Kurt Hoffmann, Taufkirchen (DE); Oskar Kowarik, Neubiberg (DE); Thomas Röhr, Aschheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/817,578

(22) Filed: Mar. 26, 2001

Related U.S. Application Data

(63) Continuation of application No. PCT/DE99/02984, filed on Sep. 17, 1999.

(30) Foreign Application Priority Data

Sep. 25, 1998 (DE) .......................... 198 44 101

(51) Int. Cl.[7] .............................................. G11C 11/22
(52) U.S. Cl. ........................................ 365/145; 365/149
(58) Field of Search ................................. 365/145, 149

(56) References Cited

U.S. PATENT DOCUMENTS

| 5,621,680 A |   | 4/1997  | Newman et al. ............ 365/145 |
|-------------|---|---------|-----------------------------------|
| 5,959,922 A | * | 9/1999  | Jung ........................... 365/145 |
| 5,978,250 A |   | 11/1999 | Chung et al. ................ 365/145 |
| 6,088,257 A | * | 7/2000  | Jeon et al. .................. 365/145 |
| 6,147,896 A | * | 11/2000 | Kim et al. ................... 365/145 |

FOREIGN PATENT DOCUMENTS

| EP | 0 365 002 B1 | 4/1990 |
|----|--------------|--------|
| WO | WO 00/19443  | 4/2000 |

* cited by examiner

*Primary Examiner*—Trong Phan
(74) *Attorney, Agent, or Firm*—Herbert L. Lerner; Laurence A. Greenberg; Werner H. Stemer

(57) ABSTRACT

A circuit for generating a reference voltage for the reading out from and the evaluation of read output signals which are read out with a constant plate voltage from storage cells of a ferroelectric memory via bit lines. In the circuit, a reference voltage device is formed of two reference cells that are subjected to the action of complementary signals. The reference cells can be simultaneously read out in order to generate the reference voltage in a selection and evaluation device.

3 Claims, 4 Drawing Sheets

CIRCUIT CONFIGURATION FOR GENERATING A REFERENCE VOLTAGE FOR READING A FERROELECTRIC MEMORY

CROSS-REFERENCE TO RELATED APPLICATION

This application is a continuation of copending International Application No. PCT/DE99/02984, filed Sep. 17, 1999, which designated the United States.

BACKGROUND OF THE INVENTION

Field of the Invention

The invention relates to a circuit configuration for generating a reference voltage for reading and evaluating read signals that are read from memory locations of a ferroelectric memory with a constant plate voltage via bit lines. The circuit configuration has a reference voltage device and a selection and evaluation device that is connected to the bit lines.

In dynamic read/write access memories (DRAMs) a read signal lies above or below a reference level. In this example, a voltage value is larger than VREF for "1" and smaller than VREF for "0". The generation of the reference signal VREF with 0 V or nearly 0 V is relatively simple here.

In ferroelectric memories (FeRAM), the relations are more complicated than this. Both the read signal for "1" and that for "0" are greater than 0 V and have a characteristic of the voltage relative to time. Because the characteristics of the two read signals for "1" and "0" run in the same direction, it is more difficult than in DRAMs to generate a reference signal VREF that is always midway between "0" and "1".

Initially, in order to solve this problem, double locations (what are known as 2T2C locations) were used in FeRAMs, which consist of two locations, each having a transistor and a capacitor. In a first location, the signal to be stored is written, whereas the complementary signal is entered into a second location. Both locations are then available in the readout. The disadvantage of this procedure is that a relatively large area is consumed, but, the noise interval is reduced as a result of what is known as the "imprint" effect.

The problem of a large consumption of space per se can be solved by single locations (1T1C-locations) having one transistor and one capacitor. The 1T1C locations can thus achieve basically the same storage density as in DRAMs, though they require a reference location for generating the reference signal (see the reference by H. Koike et al., titled "A 60 ns 1-Mb Nonvolatile Ferroelectric Memory with a Nondriven Location Plate Line Write/Read", IEEE J. Of Solid-State Circuits, Vol. 31, Nr. 11, November 1996: pp. 1625–1634). If the known 1T1C location is used the same way as the locations of DRAMs, the location capacity of the reference location must be configured differently than the location capacity of the actual memory location. This is disadvantageous, however, because it requires a fine adjustment of the location capacity in order to obtain an exact reference voltage VREF as the actual arithmetic mean of the two voltages V1 and V0 for "1" and "0", which always gives rise to read signal losses at an evaluator due to fluctuations in the technology and other influences. This is undesirable above all given low supply voltages. Likewise, various aging effects of the memory location and the reference location can be disadvantageous.

These disadvantages are avoided in another solution of the above problem (see the reference by H. Hirand, titled "2V/100 ns 1T/1C Non-Volatile Ferroelectric Memory Architecture with Bitline-Driven Read Scheme ... ", IEEE J. of Solid-State Circuits, Vol. 32, Nr. 5, May 1997: 649–654), in which aging of the memory location is prevented by always keeping it in a non-polarized state at 0 V. This is accomplished in that a specific set voltage is specified when the reference location is reset. But in this case the precision of the achievable reference voltage is dependent upon the set voltage and its temperature response.

Generally, in the read process in ferroelectric memories a location in the form of a capacitor having a ferroelectric dielectric, for instance composed of bismuth barium tantalate (WBT) or lead zirconium titanate (BZT), is connected to a selection transistor by way of a bit line. On the basis of the relations of the capacitors, the payload signal that emerges on the bit line is on the order of 100 mV. This relatively small payload signal is amplified in a read amplifier to the full logic level for "1" or "0". However, as mentioned above, the read amplifier requires the reference voltage, which should ideally represent the mean value of the voltages that are obtained in the readout of a "0" and a "1" from a memory location.

It is possible to generate such a reference voltage VREF by reading two reference locations that contain inverse information on a bit line pair. The arithmetic mean of the two previously obtained read signals is then formed by subsequently shorting the bit line pair. The reference signal is left on one of the two bit lines, while the memory location that will be read is activated on the other bit line. Next, the voltage that has been read is compared in the read amplifier to the reference voltage and amplified to the full logic level.

This kind of procedure does permit a relatively precise generation of a reference signal; however, it requires a relatively long time as a result of the serial sequence of the generation of the individual signals.

SUMMARY OF THE INVENTION

It is accordingly an object of the invention to provide a circuit configuration for generating a reference voltage for reading a ferroelectric memory that overcomes the above-mentioned disadvantages of the prior art devices of this general type, wherein the reference voltage can be provided at a precise level despite a shortened read cycle.

With the foregoing and other objects in view there is provided, in accordance with the invention, a circuit configuration containing a ferroelectric memory having memory locations supplied with a constant plate voltage. A first bit line pair formed of bit lines each connected to one of the memory locations, is provided. A selection and evaluation device is connected to the bit lines of the first bit line pair. A second bit line pair formed of bit lines is provided. Selection transistors are provided and each have a first terminal connected to the selection and evaluation device and a second terminal connected to one of the bit lines of the second bit line pair. A reference voltage device is provided and has two reference locations that can be charged with complementary signals and read into the selection and evaluation device simultaneously for generating a reference voltage for reading and evaluating read signals read from the memory locations. Each of the two reference locations is connected to one of the bit lines of the second bit line pair and can be read to the selection and evaluation device through a corresponding one of the selection transistors.

The object is inventively achieved in a circuit configuration of the above described type in that the reference voltage device contains two reference locations that can be charged with complementary signals and read simultaneously into the selection and evaluation device in order to generate the reference voltage.

Thus, the two reference locations are used simultaneously in the inventive circuit configuration. These two reference locations are precharged to "1" or "0" via two lines prior to the beginning of the read process, so that a voltage corresponding to "1" is stored in one reference location, and a voltage corresponding to "0" is stored in the other reference location. The two reference locations are then output simultaneously onto one reference bit line at the beginning of the read process, so that it sets a precise reference voltage on the reference bit line. In a preferred embodiment, the restoring of "1" and "0" to the reference locations can be accomplished by way of separately provided supply lines.

Another preferred embodiment of the invention provides that the reference locations can be recharged via the bit lines themselves given the implementation of appropriate wiring measures. Each reference location can be connected to each of the two bit lines of the pair by way of a respective selection transistor that is controlled by a word line.

In another advantageous development of the invention, the two reference locations are connected to an additional bit line pair and can be read to the selection and evaluation device via respective selection transistors.

As a result, it is possible to generate the read signal, i.e. the payload signal, from the memory location simultaneously with the reference voltage and not subsequently thereto. The reference voltage is thus not generated on the pair of bit lines on which the memory location that will be read is actuated. Rather, the reference voltage is generated using a bit line pair in another array, on which two reference locations with inverse information can be read, in turn. By subsequently shorting the bit line pair, the arithmetic mean of the two signals is obtained. At the same time as this generation of the reference voltage, the actual memory location is read in a different array than the array of the reference locations. The read signal and the reference signal are switched onto the inputs of a read amplifier by correspondingly controlled selection transistors and amplified there.

What this "parallelization" of the read process achieves is a substantial shortening of the read access. Additional lines are not needed here, either, since inactive bit line pairs in another array can be utilized to generate the reference voltage.

In accordance with another feature of the invention, a separate supply line is connected to and recharges the two reference locations.

In accordance with a further feature of the invention, each of the reference locations has a capacity corresponding to a capacity of each of the memory locations.

Other features which are considered as characteristic for the invention are set forth in the appended claims.

Although the invention is illustrated and described herein as embodied in a circuit configuration for generating a reference voltage for reading a ferroelectric memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 8:
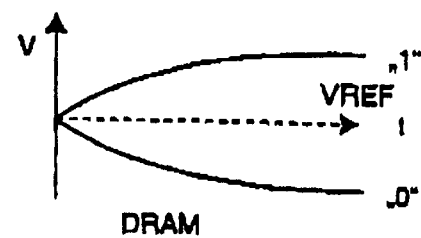
FIG. 8 is a diagram showing the reference voltage VREF in a DRAM.

In all the figures of the drawing, sub-features and integral parts that correspond to one another bear the same reference symbol in each case. Referring now to the figures of the drawing in detail and first, particularly, to FIG. 8. In dynamic read/write access memories (DRAMs) a read signal lies above or below a reference level with a value of 0 volts. This is represented in FIG. 8, in which the time characteristics of a read signal "1" and a read signal "0" are schematically illustrated. In this example, a voltage value V is larger than VREF for "1" and smaller than VREF for "0". The generation of the reference signal VREF with 0 V or nearly 0 V is relatively simple here.

Figure 7:
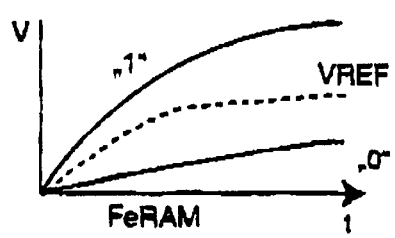
FIG. 7 is a diagram showing a setting of a reference voltage VREF in a FeRAM.

In ferroelectric memories (FeRAM), the relations are more complicated than this. Both the read signal for "1" and that for "0" are greater than 0 V and have a characteristic of the voltage V relative to time t as represented schematically in FIG. 7. Because the characteristics of the two read signals for "1" and "0" run in the same direction, it is more difficult than in DRAMs to generate a reference signal VREF that is always midway between "0" and "1".

Figure 9:
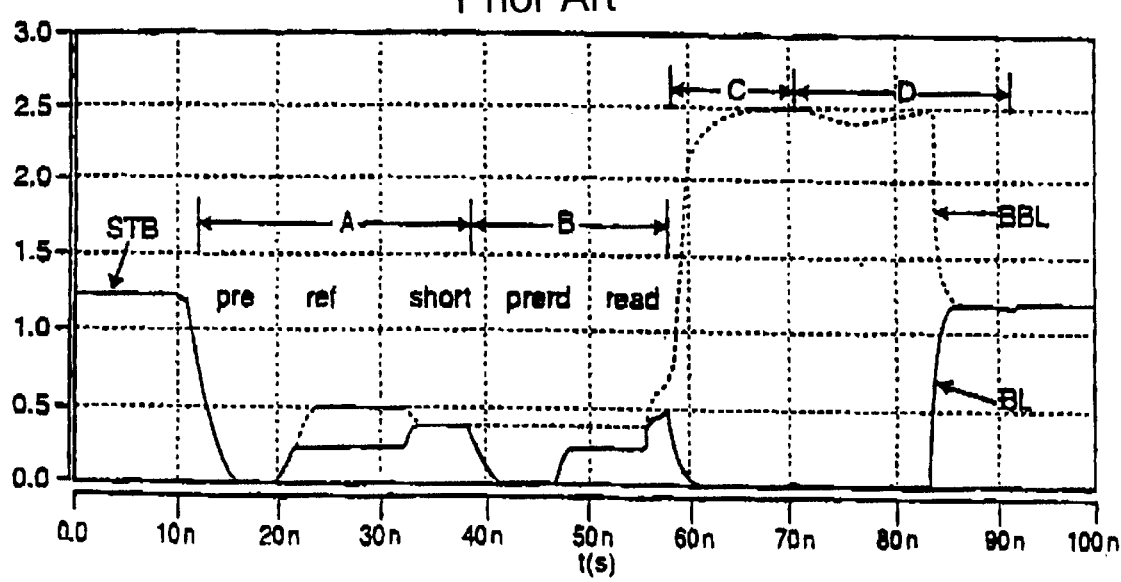
FIG. 9 is a timing diagram showing the signal characteristics for an existing configuration.

In the prior art, the sequential generating of the reference voltage using two reference locations and the subsequent reading to the memory location is represented schematically in the signal diagram of FIG. 9. A read cycle begins at t=10 ns with a negative edge of a sample or strobe STB signal. Next, a reference voltage is generated in a time frame A. To accomplish this, the two bit lines are first discharged to 0 volts pre. Then the two reference locations with inverse information are read out ("ref"); and finally the arithmetic mean is formed by shorting the two bit lines ("short"). In a subsequent time segment B, the bit line that will be read is discharged to 0 V ("prerd"), and the memory location is read ("read"). There is now a voltage at the bit line that will be read which is smaller or larger than the reference voltage, depending on the contents of the memory. In the subsequent amplification process during time-frame "C", the small voltage difference is amplified to the full logic level. At approximately t=70 ns, i.e. some 60 ns after the beginning of the read cycle, the information that has been read is available on the bit lines BL and BBL for further processing. Finally, the information is restored to the reference locations, and there occurs a return to idle state during a time-frame D.

Figure 1:
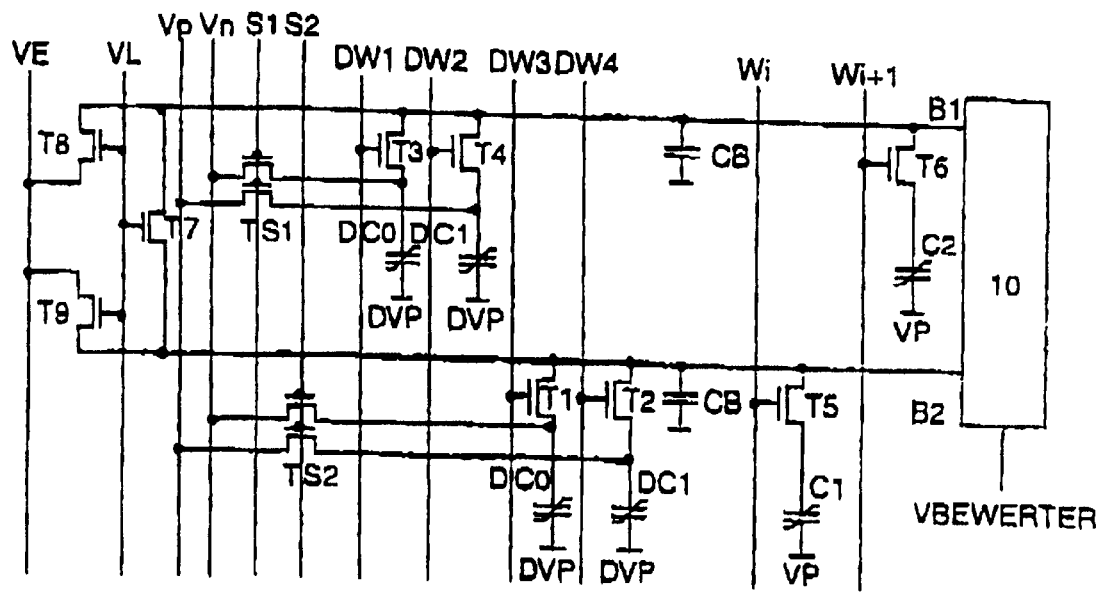
FIG. 1 is a circuit diagram of a first exemplifying embodiment according to the invention.

FIG. 1 shows a circuit configuration according to the invention having bit lines B1 and B2 that are held at half a supply voltage potential VCC/2 at time t0 (see FIG. 2) via precharging lines VE and VL ("precharging"). To accomplish this, the bit lines B1 and B2 are connected to the lines VL and VE, respectively, via transistors T7, T8 and T9.

At time t1 the bit lines B1 and B2 are precharged to 0 V in that the line VE is set at 0 V.

At time t2 the contents of a memory location C1 at which a plate voltage VP is present are dumped onto the bit line B2 via a transistor TS by a switching of word lines Wi and the contents of reference locations DC0, DC1 with plate voltages DVP are moved onto the reference bit line B1 via transistors T3 and T4 by switching of word lines DW1 and DW2. The reference voltage then emerges as the mean between a "1" signal and a "0" signal on the reference bit line B1. Supply lines S1, S2 for recharging the reference locations DC0, DC1 are deactivated at this time by transistors TS1, TS2.

If the bit line and the reference bit line are reversed, with B1 being the bit line and B2 being the reference bit line, then word lines Wi+1 and DW3 and DW4 are active. The rest of the operation proceeds accordingly, as described above. In this case, the memory location is formed by a storage capacitor C2.

At a time t3 a selection and evaluation device 10 is activated by an evaluation signal VBEWERTER; in the case of the present example the read result "1" on the bit line B2 is amplified to a voltage VCC, and the reference bit line B1 is drawn to 0 V. The process runs in reverse given the readout of a "0".

Because at time t4 the supply line S1 is set at VCC, the line $V_p$ is set at VCC, and the line $V_n$ is set to 0 V, the reference locations DC1 and DC0 are polarized at "1" and "0", respectively.

Lastly, at time t5 all word lines DW1, DW2, DW3, DW4, Wi, Wi+1 are deactivated; the signal on the line VL is set to VCC; and the signal on the line VE is set to VCC/2; so that the bit lines B1, B2 are at VCC/2. The ultimate result of bringing the line S1 to VCC and the lines $V_p$ and $V_n$ to VCC/2 is that the voltage at the reference locations DC0, DC1 is set at 0 V, since the plate voltage VP is VCC/2.

In order to avoid an imbalance in the capacities of the bit line B2 and the reference bit line B1, the capacities of the reference locations DC0, DC1 are only half as large as the capacities of the memory locations CB. If the layout precludes a halving of the capacity of the reference locations DC0, DC1, then the cell plate voltage VP is simultaneously set such that a capacitive imbalance is compensated.

Figure 2:
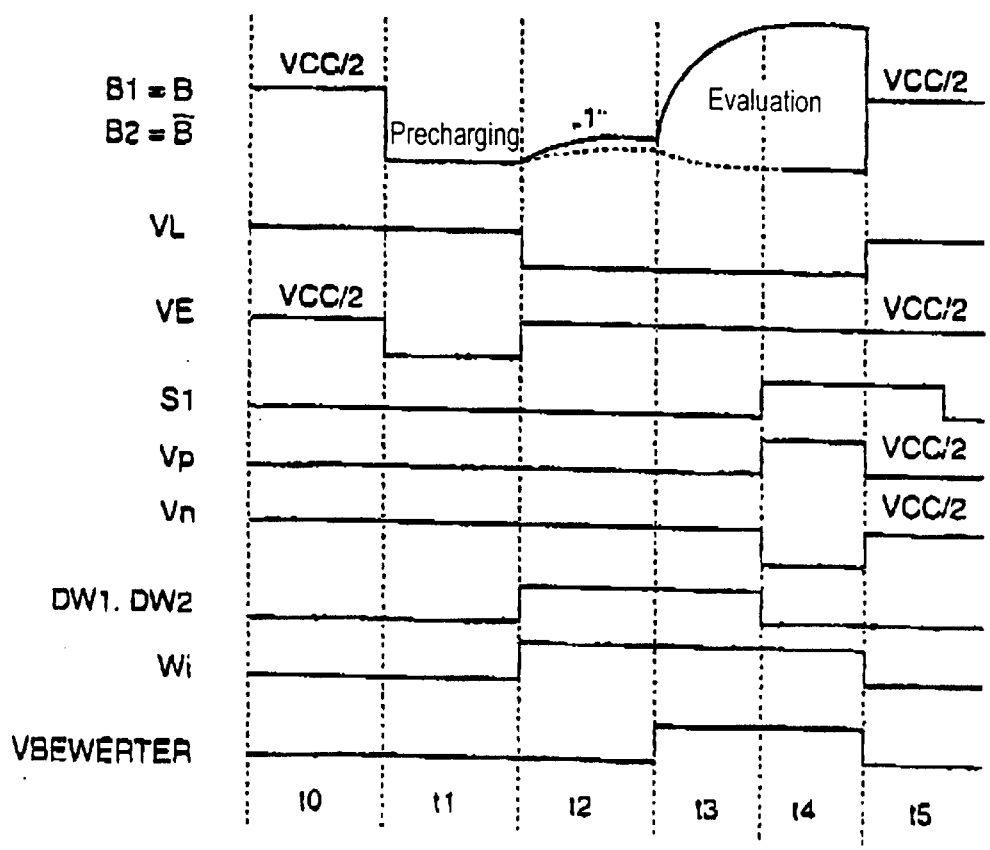
FIG. 2 is a timing diagram representing signal characteristics for the first exemplifying embodiment.

The circuit configuration of the exemplifying embodiment of FIGS. 1 and 2 makes possible the following specific advantages. The circuit configuration is very fast compared to existing reference voltage circuits. The reference voltage VREF is exactly between a "1" and a "0". The reference voltage VREF is relatively insensitive to temperature fluctuations. The reference voltage VREF is relatively insensitive to aging influences and fatigue. This is expedient because the reference locations DC0, DC1 are typically reprogrammed substantially more frequently than normal memory locations. The reference voltage can still be calibrated by shifting the plate voltage VP and/or DVP, for instance in the testing of the FeRAM via a laser connection for setting the plate voltage VP. In the present exemplifying embodiment, two reference locations DC0, DC1 are given to the bit line B1 simultaneous to the reading of the memory signal, in order to generate a reference voltage. A specific advantage hereof is that the reading can occur rapidly and precisely. The restoring of "1" and "0" to the reference locations is accomplished via separately provided supply lines. Two reference locations with a "1" and a "0" are thus added to the conventional ferroelectric memory locations, these reference locations being connected so as to produce a precise reference voltage VREF.

Another exemplifying embodiment of the inventive circuit configuration will now be described with reference to FIGS. 3 and 4. In this exemplifying embodiment, too, the bit lines B1, B2 are held at half the supply voltage VCC/2 at the time t0 by the precharging lines VE and VL, respectively.

At a time t1 the precharging line VE is brought to 0 V in order to precharge the bit lines B1 and B2 to 0 V.

At time t2, by switching the word lines Wi as well as DW1 and DW3, the contents of the memory location C1 are outputted onto the bit line B2 by way of the transistor T5, and the contents of the reference locations DC0, DC1 are outputted onto the reference bit line BE, so that the reference voltage is obtained on the reference bit line B2 as the mean between the "1" signal and the "0" signal.

If, as in the examples of FIGS. 1 and 2, the bit line and the reference bit line are reversed, with the line B1 being the bit line and the line B2 being the reference bit line, then the word lines Wi+1, as well as DW2 and DW4, are activated.

At time t3 the selection and evaluation device 10 is activated by an evaluation signal VBEWERTER; in the case of the present example the read result "1" on the bit line B2 is amplified to the voltage VCC, and the reference bit line B1 is drawn to 0 V. The process runs in reverse given the readout of a "0".

At time t4, in order to restore the correct signal into the reference location DC1, the word line DW3 is deactivated, and the word line DW4 is activated. If the bit line and the reference bit line are reversed, with B1 being the bit line and B2 being the reference bit line, then the word line DW1 is deactivated, and the word line DW2 is activated.

At time t5 the word line Wi is deactivated, and the precharging line VL is set to VCC, while the precharging line VE is brought to VCC/2. Thus, the bit lines B1, B2 are at VCC/2. The result of activating the word lines DW1 and DW4 is that the voltage at the reference locations DC0, DC1 is set at 0 V, since the plate voltage VP is VCC/2. Next, all word lines DW1, DW2, DW3, DW4, Wi, Wi+1 are deactivated.

For the charging and discharging of the reference locations DC0, DC1, switching transistors T11, T12, T13, T14 can be actuated by way of the respective word lines DW1, DW2, DW3 and D4, whereby they connect the reference locations to the bit lines B1 and B2 and disconnect them therefrom.

In order to avoid an imbalance in the capacities of the bit line B2 and the reference bit line B1 (or vice versa), as in the exemplifying embodiments in FIGS. 1 and 2, the reference locations DC0 and DC1 are selected to be only half as large as the memory locations CB. If the layout precludes a halving of the capacity of the reference locations DC0, DC1 in this case as well, then the plate voltage DVP and/or VP at the location is simultaneously set such that a capacitive imbalance is compensated.

Figure 3:
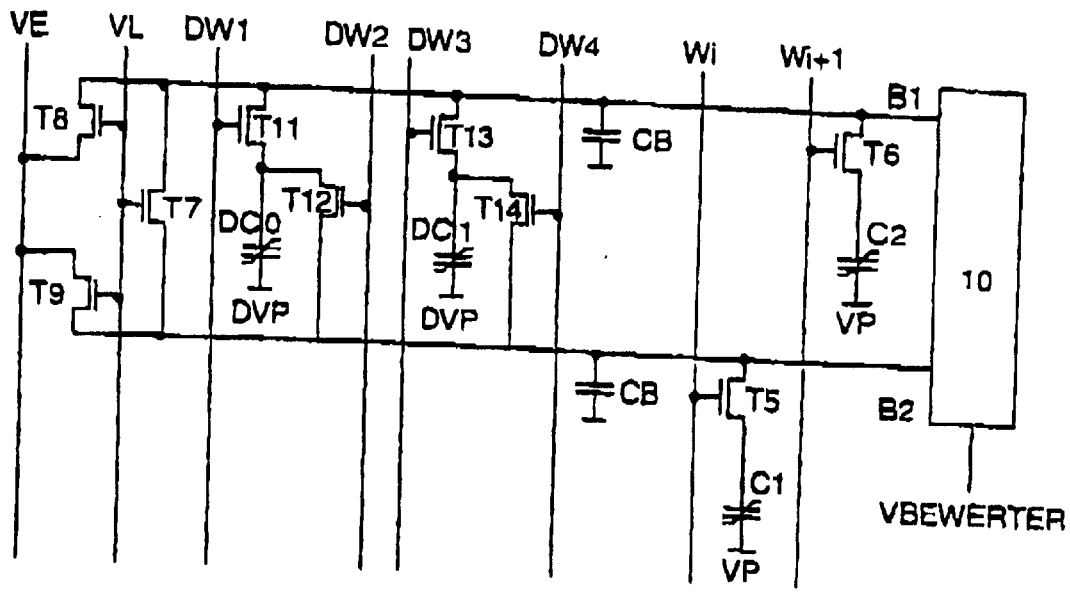
FIG. 3 is a circuit diagram of a second exemplifying embodiment.
Figure 4:
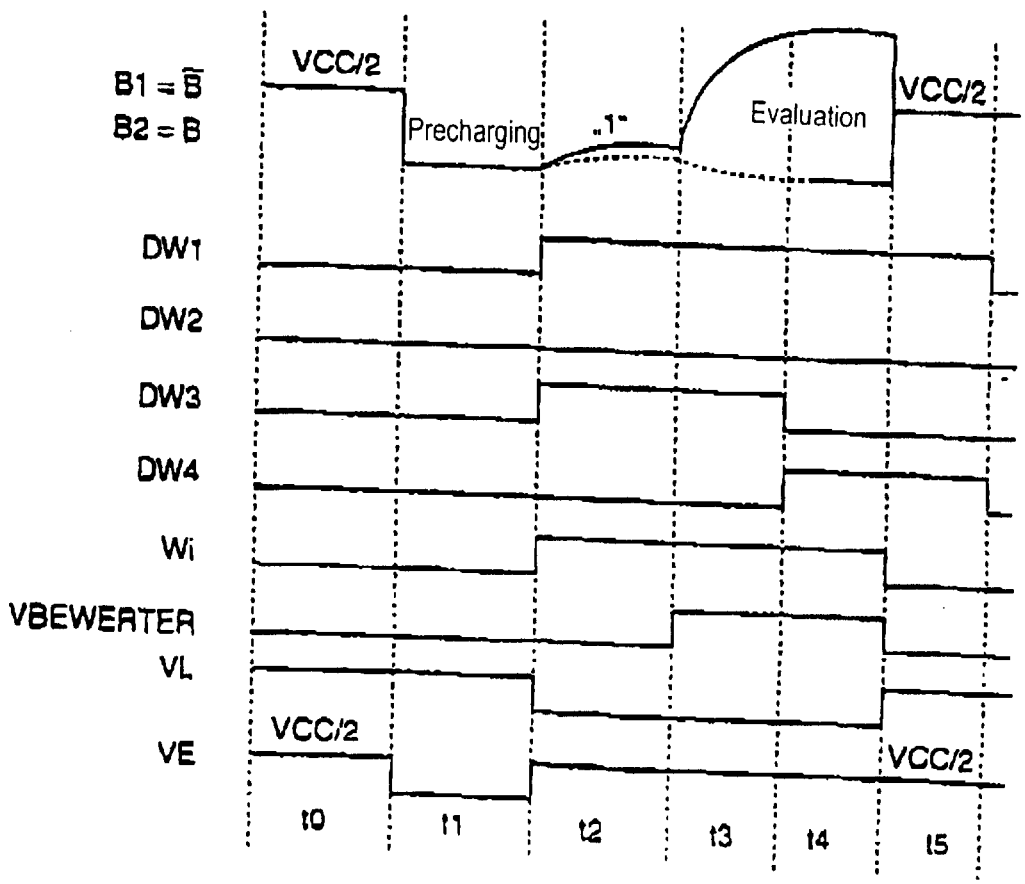
FIG. 4 is a timing diagram representing the signal characteristics for the second exemplifying embodiment.

Like the circuit configuration of the exemplifying embodiment of FIGS. 1 and 2, the present exemplifying embodiment of the FIGS. 3 and 4 offers the following specific advantages. The circuit configuration is very fast compared to existing reference voltage circuits; the additional required time t4 does not affect the access time. The reference voltage VREF is exactly between a "1" and a "0". The reference voltage VREF is relatively insensitive to temperature fluctuations.

The reference voltage VREF is relatively insensitive to aging influences and fatigue. This is expedient because the reference locations DC0, DC1 are typically reprogrammed substantially more frequently than normal memory locations. The reference signal can still be calibrated by shifting the plate voltage VP and/or DVP, for instance in the testing of the FeRAM via laser connections for setting the plate voltage VP. As in the first exemplifying embodiment represented in FIGS. 1 and 2, only two reference locations are required per bit line pair.

Contrary to the exemplifying embodiment in FIG. 1, in the exemplifying embodiment of FIG. 3 the reference locations are recharged by restoring from the bit lines B1 and B2 by way of suitable wiring measures which are implemented separately (see the transistors T11 to T14).

Figure 5:
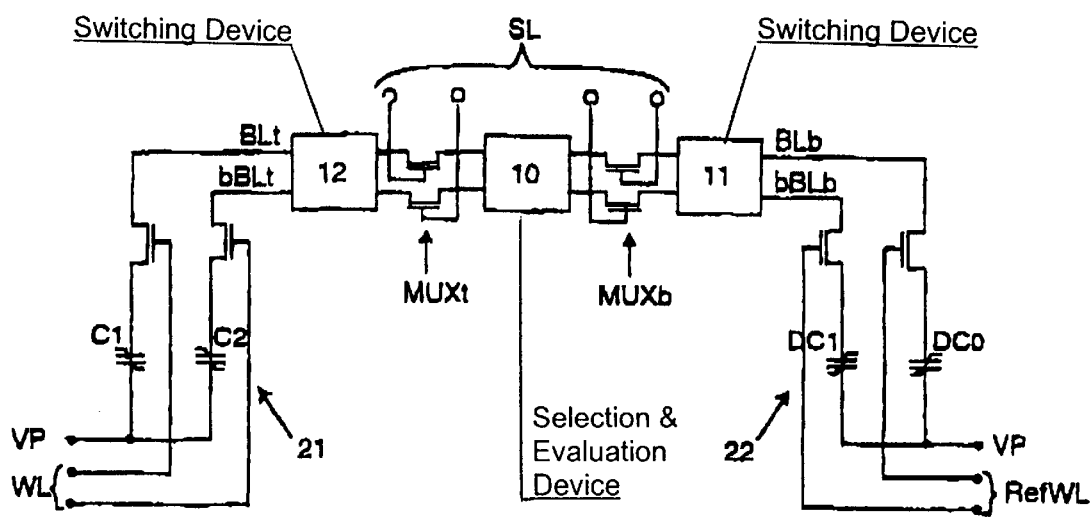
FIG. 5 is a circuit diagram of a third exemplifying embodiment.

Another preferred exemplifying embodiment of the present invention will now be described with reference to FIGS. 5 and 6.

In the exemplifying embodiment a read amplifier is situated, as in DRAMs, between two memory arrays 21, 22 as a selection and evaluation device 10 and is used by the memory arrays 21, 22. The reference locations DC0 and DC1 and the memory locations that will be read are connected to different bit line pairs BLb/bBLb and BLt/bBLt, respectively. Selection transistor pairs MUXb and MUXt are separate here, as opposed to the prior art, which is essential, so that a total of four selection transistors are created for the two bit line pairs, which are connected to the read amplifier 10 on line side. This separating of the selection transistors makes possible the simultaneous generating of the reference voltage (see right half of FIG. 5) and reading of the memory locations (see left half of FIG. 5) by way of switching devices 11 and 12. To this end, the selection transistors of the memory locations and of the reference locations, as well as the selection transistors MUXb and MUXt, are actuated via word lines WL and control lines SL.

Figure 6:
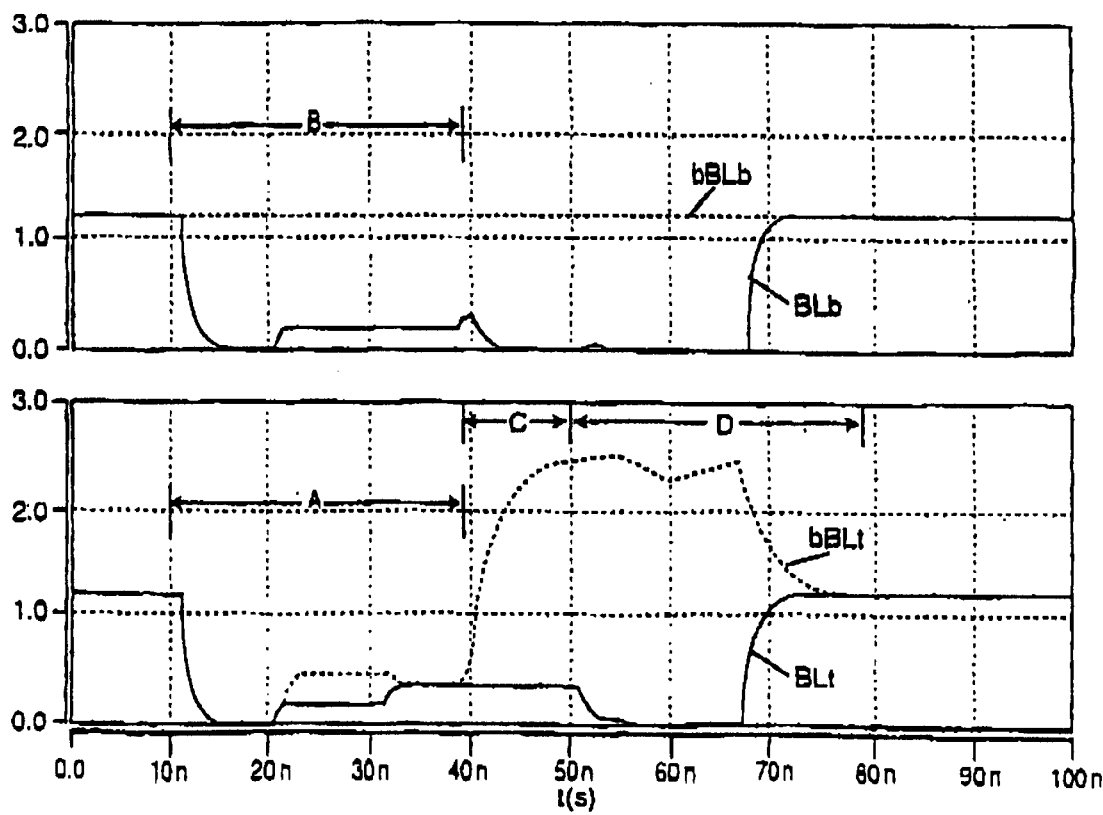
FIG. 6 is a timing diagram representing the signal characteristics for the third exemplifying embodiment.

For instance, the read process begins at time t=10 ns with the negative edge of the strobe or sample signal (see FIG. 6). The generation of the reference voltage in a time-frame A and the readout of the storage location in a time-frame B are simultaneously started on bit line pairs BLb/bBLb and BLt/bBLt which are not electrically connected, which is essential. Subsequently, the read signal and the reference signal are switched onto the read amplifier by two of the four selection transistors—for instance by the top transistor of the transistors MUXb in FIG. 5 and the bottom transistor of the transistors MUXt in FIG. 5—and the difference signal is amplified, which occurs in the time-frame C. Approximately at t=50 ns, i.e. 40 ns after the beginning of the read cycle, the information that is read out is available on the bit lines for further processing. Lastly, the information is written back into the reference locations, and an idle state is restored during the time-frame D.

As emerges from a comparison to FIG. 9, the time until the valid data is made available can be shortened from approx. 60 ns to 40 ns by the parallelized read process.

We claim:

1. A circuit configuration, comprising:
    a ferroelectric memory having memory locations supplied with a constant plate voltage;
    a first bit line pair formed of bit lines each connected to one of said memory locations;
    a selection and evaluation device connected to said bit lines of said first bit line pair;
    a second bit line pair formed of bit lines;
    selection transistors each having a first terminal connected to said selection and evaluation device and a second terminal connected to one of said bit lines of said second bit line pair; and
    a reference voltage device having two reference locations that can be charged with complementary signals and read into said selection and evaluation device simultaneously for generating a reference voltage for reading and evaluating read signals read from said memory locations, each of said two reference locations connected to one of said bit lines of said second bit line pair and can be read to said selection and evaluation device through a corresponding one of said selection transistors.

2. The circuit configuration according to claim 1, including a separate supply line connected to and recharging said two reference locations.

3. The circuit configuration according to claim 1, wherein each of said reference locations has a capacity corresponding to a capacity of each of said memory locations.

* * * * *